United States Patent
Lindsey, Jr. et al.

(10) Patent No.: US 8,906,745 B1
(45) Date of Patent: Dec. 9, 2014

(54) METHOD USING FLUID PRESSURE TO REMOVE BACK METAL FROM SEMICONDUCTOR WAFER SCRIBE STREETS

(71) Applicants: Paul C. Lindsey, Jr., Lafayette, CA (US); Darrell Foote, Walnut Creek, CA (US)

(72) Inventors: Paul C. Lindsey, Jr., Lafayette, CA (US); Darrell Foote, Walnut Creek, CA (US)

(73) Assignee: Micro Processing Technology, Inc., Lafayette, CA (US)

( * ) Notice: Subject to any disclaimer, the term of this patent is extended or adjusted under 35 U.S.C. 154(b) by 0 days.

(21) Appl. No.: 14/273,755

(22) Filed: May 9, 2014

Related U.S. Application Data

(60) Provisional application No. 61/876,847, filed on Sep. 12, 2013.

(51) Int. Cl.
*H01L 21/78* (2006.01)

(52) U.S. Cl.
CPC .................................. *H01L 21/78* (2013.01)
USPC ........................................... 438/114; 438/462

(58) Field of Classification Search
USPC .................................................... 438/114, 462
See application file for complete search history.

(56) References Cited

U.S. PATENT DOCUMENTS

| | | | |
|---|---|---|---|
| 5,501,893 A | 3/1996 | Laermer et al. | |
| 6,417,013 B1 | 7/2002 | Teixeira et al. | |
| 7,115,485 B2 * | 10/2006 | Priewasser | 438/464 |
| 7,195,988 B2 * | 3/2007 | Nemoto et al. | 438/459 |
| 7,559,826 B2 * | 7/2009 | Sekiya | 451/41 |
| 7,888,237 B2 * | 2/2011 | Kim et al. | 438/462 |
| 8,445,361 B1 | 5/2013 | Lindsey, Jr. | |
| 8,450,188 B1 | 5/2013 | Lindsey, Jr. | |
| 8,664,089 B1 | 3/2014 | Burghout et al. | |

* cited by examiner

*Primary Examiner* — Earl Taylor
(74) *Attorney, Agent, or Firm* — Thomas R. Lampe

(57) ABSTRACT

A method of dividing a semiconductor wafer in which a sheet of deformable material engaging the metal layer side of the wafer has pressurized fluid applied thereto to cause the metal layer to break at the locations of wafer scribe streets.

20 Claims, 2 Drawing Sheets

METHOD USING FLUID PRESSURE TO REMOVE BACK METAL FROM SEMICONDUCTOR WAFER SCRIBE STREETS

This application is based on and claims the benefit of U.S. Provisional Patent Application No. 61/876,847, filed Sep. 12, 2013.

TECHNICAL FIELD

The present invention relates to separation of semiconductor devices from a semiconductor wafer.

BACKGROUND OF THE INVENTION

In the past, numerous different methods have been used for singulating or dicing a semiconductor wafer, the process of dividing a semiconductor wafer into individual devices. The two most widely used methods at this time are sawing using a diamond saw blade and laser scribing using a focused laser beam to cut through the wafer. Neither method is ideal. Both result in a significant loss of material during the cutting process. As the size of semiconductor devices get smaller, the width of the line of lost material during the dicing process becomes comparable to the width of the device. If the width of the line of material lost during the scribing process could be made significantly smaller, many more devices could be made on each wafer, resulting in a large savings in the cost of fabricating the devices. In addition, both the sawing and laser scribing cause damage along the cut edges of the devices that can result in rejected devices during visual inspection and in some cases cracking that can cause device failure in the field.

Since the invention of plasma and reactive ion etching in the 1970s, many individuals have proposed using these processes for wafer singulation. These processes potentially could decrease the material loss during the dicing process by etching very narrow scribe lines through the semiconductor wafer. In addition, since the etch process takes place at a microscopic level and involves no heat or mechanical grinding, the edge of the semiconductor devices are not damaged by the process. In order for a plasma etching or a reactive on etching process to be effective in wafer dicing, it would have to etch very deep, narrow trenches in the scribe streets of the semiconductor wafer and it would have to etch at a very fast etch rate to be economically attractive. These two conditions have been achieved by Teixeira, et al (U.S. Pat. No. 6,417, 013) building on the work of Laemer, et al., (U.S. Pat. No. 5,501,893). The single issue remaining to be resolved was a cost effective method of removing the back metal that remains in the scribe street after the etch process is completed. My U.S. Pat. Nos. 8,445,361 and 8,450,188 address this matter.

Semiconductor wafers usually have one or more metal layers applied to the back of the wafer during fabrication to provide ohmic contact and/or ease of die attach during packaging of the devices. These layers of metal are not readily etched using dry etch processes.

U.S. Pat. No. 8,445,361, issued May 21, 2013, relates to a method of dividing a semiconductor wafer having a metal layer including removing all or substantially all of the semiconductor material in scribe streets while the wafer is supported by a support, turning over the wafer and while using a second support to support the wafer, introducing a heat energy flux into the metal layer to remove metal of the metal layer from the scribe streets.

U.S. Pat. No. 8,450,188, issued May 28, 2013, relates to a method of dividing a semiconductor wafer having a metal layer and a semiconductor material layer including the step of cutting the semiconductor material layer along scribe streets without cutting the metal layer, turning over the wafer, and cutting the metal layer along the scribe streets.

U.S. Pat. No. 8,664,089 (Burghout et al.), issued Mar. 4, 2014, discloses a semiconductor die singulation method wherein semiconductor die are singulated from a semiconductor wafer having a back metal layer by placing the semiconductor wafer onto a carrier tape with the back metal layer adjacent the carrier tape, forming singulation lines through the semiconductor wafer to expose the back metal layer within the singulation lines, and fluid machining the semiconductor wafer to remove the back metal layer from the singulation lines.

Burghout et al. describes a method of removing the back metal layer by flipping the wafer over on another piece of adhesive plastic film after the plasma etch has been completed to expose the back metal to a fluid ejected from a nozzle. While Burghout et al. employs the term "pressurized fluid" when relating to the process for removing the back metal, in the Burghout et al. approach the fluid is pressurized only in order to eject it through a nozzle. However, after the fluid leaves the nozzle, under a basic law of physics, the fluid must be at atmospheric pressure and is no longer a "pressurized fluid". It is not a "pressurized fluid" when it impinges on the metal layer to affect its removal. The Burghout et al. removal process is being carried out by the momentum of a previously pressurized fluid.

DISCLOSURE OF INVENTION

The present invention relates to a method to effectively separate the back metal layers in the semiconductor wafer scribe streets from the individual die that does indeed use a pressurized fluid.

More particularly, the invention is a method of dividing a semiconductor wafer having a first wafer side including a semiconductor material layer, a second wafer side including a metal layer, and etched scribe streets extending from said first wafer side through said semiconductor material layer to said metal layer between semiconductor material dies.

The method includes the steps of placing a sheet of deformable material into engagement with the second wafer side to cover the second wafer side.

The semiconductor wafer is then positioned with the first wafer side thereof in engagement with a support surface and employing the support surface to support said semiconductor wafer.

While the sheet of deformable sheet material is in engagement with the second wafer side, fluid contacting the sheet of deformable material is pressurized to deform the sheet of deformable material and break the metal layer at the locations of the scribe streets.

Other features, advantages and objects of the present invention will become apparent with reference to the following description and accompanying drawings.

MODE FOR CARRYING OUT THE INVENTION

Figure 1:
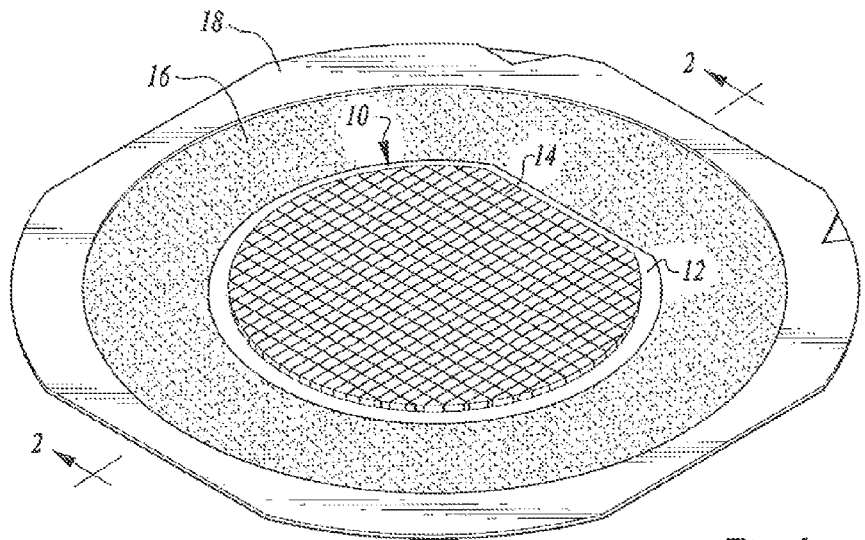
FIG. 1 is a top, perspective view illustrating a semiconductor wafer having a metal layer base adhesively secured to and supported by a plastic sheet surrounded by a frame and a semiconductor material layer which has been etched along the scribe streets, the metal layer in the scribe streets not having been etched.

Referring now to the drawings, a semiconductor wafer 10 is illustrated, the wafer having a metal layer or base 12 and a semiconductor material layer 14. The semiconductor material layer 14 of the wafer (see FIGS. 1-5) has been etched along scribe streets to form individual semiconductor material dies but leaving the metal layer intact, even in the scribe streets.

A commercially available etching machine of any suitable type may be employed to etch the semiconductor material to remove the semiconductor material in the scribe streets but leaving the metal unetched. That is, the etching process is continued in the normal fashion until the metal layer on the back side of the wafer is reached.

It is current practice to mount a semiconductor wafer to be diced or singulated on a plastic film that is stretched across a metal or plastic frame. The plastic film is usually coated with an adhesive layer.

Figure 2:
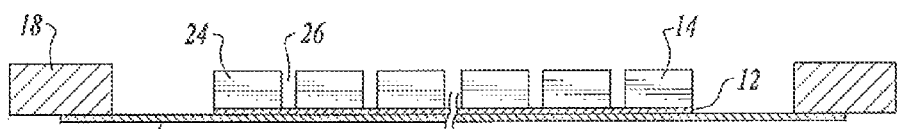
FIG. 2 is an enlarged, cross-sectional view taken along the line 2-2 of FIG. 1.
Figure 3:
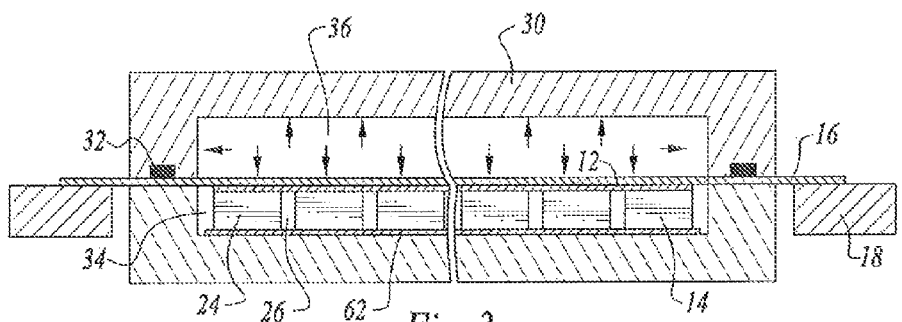
FIG. 3 is an enlarged, cross-sectional view showing the etched wafer, inverted on the flat bottom surface of a pressure chamber and the disposition of the back metal and plastic film before the application of a pressurized fluid.

In the arrangement illustrated, the metal layer 12 of the wafer 10 is adhesively attached to a plastic film 16 coated with an adhesive layer stretched on a frame 18. FIGS. 1 and 2 show the wafer 10, plastic film 16, and frame 18 removed from the etching machine after the above described etching of the semiconductor layer has been accomplished. The individual dies 24 are separated along intersecting scribe streets 26 extending across the wafer.

In the next process step, the wafer 10 is turned over and positioned on a flat surface such, as a chuck, located in a high pressure chamber 30. A fluid is pressed at high pressure against the back side of the plastic film 16. The pressure of the fluid causes the plastic film to be pressed into the back of the etched streets, breaking the metal layer at the scribe streets, and more particularly cleaving the back metal 12 along the edges of the dies 24. This process cleaves all of the back metal on the wafer 10 at the same time.

With reference to FIGS. 3, 4, 6 and 7, the wafer 10 on the plastic film 16 is placed in the pressure chamber 30 upside down with the top side of the wafer resting on a flat surface, suitably a chuck surface of the pressure chamber. A seal element 32 creates a seal between the chamber and the plastic film 16 just outside the periphery of the wafer.

Figure 4:
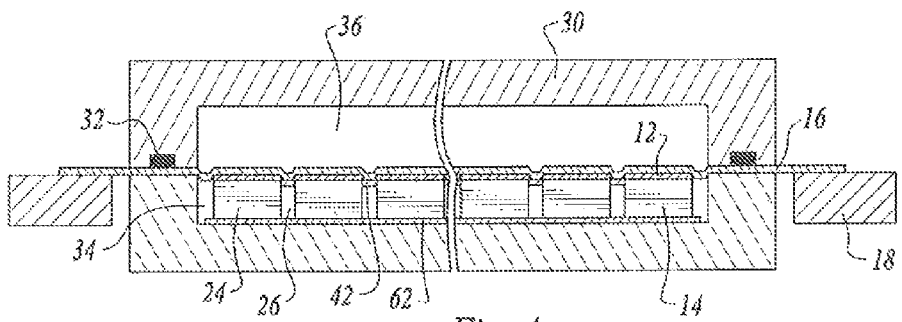
FIG. 4 is an enlarged, cross-sectional view showing the etched wafer, inverted on the flat bottom of the pressure chamber and the disposition of the back metal and plastic film after a pressurized fluid has been applied.

The portion 34 of the chamber 30 below the plastic film 16 in which the wafer is positioned is held at or near atmospheric pressure. The portion 36 of the chamber 30 above the plastic film 16 has a fluid introduced and the pressure of the fluid is raised until the segments or portions of the plastic film 16 above the etched scribe streets are pressed into the streets. The presence of high pressure fluid is indicated by arrows in FIG. 3. As shown in FIG. 4, this causes the back metal to break at the scribe streets and be cleaved along the edges of each die 42. To be concise, the cleaving process takes place because of the differential pressure between the volume of the pressurized fluid above the plastic film 16 and the volume of the fluid beneath the plastic film.

While the pressure of the fluid above the plastic film is being increased, the pressure in all of the streets under the plastic film stays essentially uniform because the continuous, crisscrossing pattern of the streets allows the fluid in this area to move freely to all areas.

Figure 6:
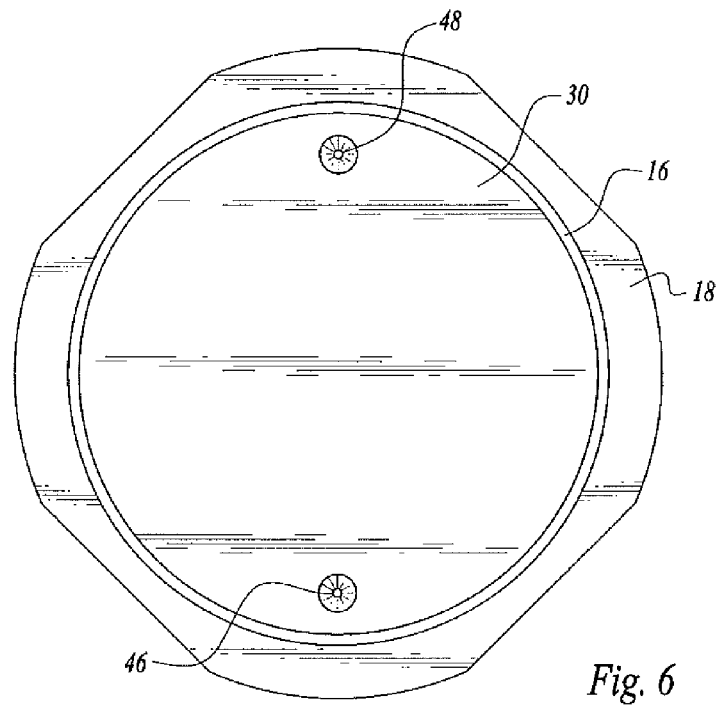
FIG. 6 is a top view of a high pressure chamber and portions of a plastic film and frame.
Figure 7:
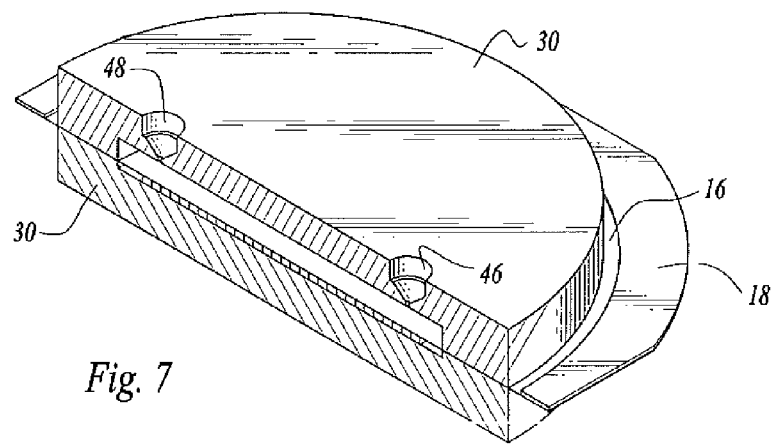
FIG. 7 is a perspective, cross-sectional view of the high pressure chamber with the frame and wafer supporting plastic film positioned in the interior of the pressure chamber.

FIG. 6 shows a pressurized fluid injection port 46 of the high pressure chamber and pressurized exit port 48 of the high pressure chamber.

Figure 5:
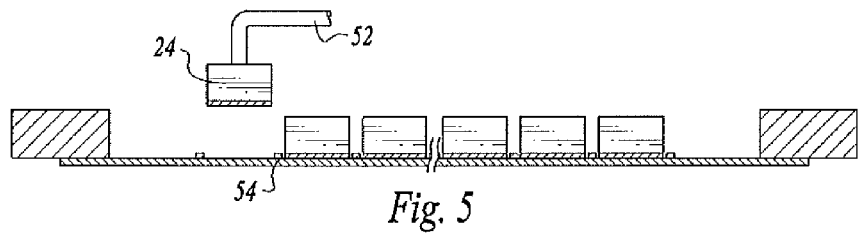
FIG. 5 is an enlarged, cross-sectional view showing a pick-and-place tool removing a singulated die from the plastic film while the cleaved back metal pieces in the scribe street remain on areas of the plastic film.

After the cleaving of the back metal has been completed, the assembly including the wafer, plastic film, and frame is removed from the high pressure chamber. It is current practice, after die singulation, to separate the die from each other by expanding the plastic film. In this case, both the individual die and the cleaved back metal pieces 54 in the scribe streets are separated by the expansion of the plastic film. As shown in FIG. 5, the die 24 are then removed from the plastic film using the tool 52 in a standard pick-and-place system, leaving the back metal pieces 54 that were in the etched streets on the plastic film 16.

Although any liquids or gases likely would work in this process, it has been found that the most easily handled fluid for use in this process is filtered, dry compressed air or dry compressed nitrogen. Preferably the pressure of the compressed air or nitrogen needs to be raised to about 10,000 psi to about 40,000 psi in order to provide sufficient movement of the plastic film to cleave the back metal. The pressure may be applied statically and gradually increased to the required value or a pulse of fluid pressure may be applied to reach the required pressure for only an instant. The required pressure depends on the thickness and composition of the plastic film.

We have found that a plastic support film 62 located between the outer surface of the die on the inverted wafer and the top of the flat surface has several important roles in ensuring the success of the back metal cleaving process. First, the plastic support film provides a clean, particle-free surface for the wafer to be placed on. A new piece of plastic support film should be provided for each new wafer being processed. This approach allows one to avoid the difficult and expensive process of cleaning the surface before each new wafer is placed on it. In addition, the plastic support film 62 can provide a cushioning surface for the wafer on the chuck during the back metal cleaving process.

The invention claimed is:

1. A method of dividing a semiconductor wafer having a first wafer side including a semiconductor material layer, a second wafer side including a metal layer, and etched scribe streets extending from said first wafer side through said semiconductor material layer to said metal layer between semiconductor material dies, said method comprising the steps of:
   placing a sheet of deformable material into engagement with the second wafer side to cover said second wafer side;
   positioning said semiconductor wafer with the first wafer side thereof in engagement with a support surface;
   employing said support surface to support said semiconductor wafer; and
   while said sheet of deformable sheet material is in engagement with said second wafer side, carrying out the step of pressurizing fluid contacting said sheet of deformable material to deform the sheet of deformable material and cause the metal layer to break at the locations of the scribe streets.

2. The method according to claim 1 wherein the fluid is a gaseous fluid.

3. The method according to claim 1 wherein the step of pressurizing said fluid includes initially applying the pressure statically and subsequently gradually increasing the pressure.

4. The method according to claim 1 wherein the step of pressurizing the fluid is carried out in an instantaneous pulse.

5. The method according to claim 2 wherein said gaseous fluid is filtered, dry compressed air or dry compressed nitrogen.

6. The method according to claim 2 wherein the gaseous fluid is pressurized to a pressure within the range of from about 10,000 psi to about 40,000 psi.

7. The method according to claim 1 wherein said sheet of deformable material is plastic film.

8. The method according to claim 1 wherein said step of pressurizing fluid is carried out within a pressure chamber accommodating said semiconductor wafer.

9. The method according to claim 1 wherein said support surface is a flat, rigid surface of said pressure chamber.

10. The method according to claim 9 wherein said flat, rigid surface is a chuck surface.

11. The method according to claim 9 including the additional step of positioning a plastic support film between said flat, rigid surface and said first wafer side.

12. The method according to claim 7 wherein said plastic film forms a fluid-tight seal with a pressure chamber accommodating said semiconductor wafer and the fluid being pressurized.

13. The method according to claim 1 wherein said deformable sheet material is pressed in the direction of said metal layer by said fluid during pressurizing of said fluid.

14. The method according to claim 13 wherein the pressure of said fluid is sufficient to cause portions of the deformable sheet material to press into said scribe streets when said metal layer is broken.

15. The method according to claim 14 wherein said deformable sheet material when portions thereof are pressed into said scribe streets is operable to cleave the metal layer along edges of said semiconductor dies.

16. The method according to claim 15 wherein said deformable sheet material is operable when pressurized to substantially simultaneously cleave the metal layer at all the scribe streets of the semiconductor wafer.

17. The method according to claim 16 wherein said deformable sheet material has outer and inner sides, said cleaving step taking place when differential pressure exists between the volume of pressurized fluid engaging the outer side of the deformable sheet material and the volume of a fluid engaging the inner side of the deformable sheet material.

18. The method according to claim 17 wherein the scribe streets of the semiconductor wafer form a continuous, crisscrossing pattern whereby fluid therein moves freely to maintain the fluid pressure in all the streets under the sheet of deformable material uniform.

19. A method of dividing a semiconductor wafer having a first wafer side including a semiconductor material layer, a second wafer side including a metal layer, and etched scribe streets extending from said first wafer side through said semiconductor material layer to said metal layer between semiconductor material dies, said method comprising the steps of:

placing a sheet of deformable material into engagement with the second wafer side to cover said second wafer side;

positioning said semiconductor wafer with the first wafer side thereof in engagement with a support surface;

employing said support surface to support said semiconductor wafer; and while said sheet of deformable sheet material is in engagement with said second wafer side, establishing a fluid pressure differential between fluid contacting opposed sides of said sheet of deformable material to deform the sheet of deformable material and break the metal layer at the locations of the scribe streets.

20. The method according to claim 19 wherein the opposed sides of said sheet of deformable material comprise an outer sheet side and an inner sheet side, said inner sheet side engaging said second wafer side, and the pressure of fluid engaging said outer sheet side exceeding the pressure of fluid at the inner sheet side.

* * * * *